(12) United States Patent
Komatani

(10) Patent No.: US 8,354,312 B2
(45) Date of Patent: Jan. 15, 2013

(54) SEMICONDUCTOR DEVICE FABRICATION METHOD

(75) Inventor: Tsutomu Komatani, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 108 days.

(21) Appl. No.: 12/860,454

(22) Filed: Aug. 20, 2010

(65) Prior Publication Data

US 2010/0317164 A1 Dec. 16, 2010

Related U.S. Application Data

(63) Continuation of application No. PCT/JP2009/052537, filed on Feb. 16, 2009.

(30) Foreign Application Priority Data

Feb. 22, 2008 (JP) .................................. 2008-041345

(51) Int. Cl.
*H01L 21/338* (2006.01)

(52) U.S. Cl. ................. 438/172; 257/E21.403

(58) Field of Classification Search ........... 257/55, 257/63, 201, E21.403; 438/172
See application file for complete search history.

(56) References Cited

U.S. PATENT DOCUMENTS

| 2004/0144991 | A1* | 7/2004 | Kikkawa | 257/103 |
| 2006/0043415 | A1* | 3/2006 | Okamoto et al. | 257/192 |
| 2006/0220063 | A1 | 10/2006 | Kurachi et al. | |
| 2007/0051979 | A1 | 3/2007 | Kambayashi et al. | |
| 2008/0203541 | A1 | 8/2008 | Makiyama | |
| 2009/0159930 | A1* | 6/2009 | Smorchkova et al. | 257/194 |
| 2009/0166815 | A1* | 7/2009 | Makiyama et al. | 257/640 |

FOREIGN PATENT DOCUMENTS

| JP | 2004-221325 A | 8/2004 |
| JP | 2006-278812 A | 10/2006 |
| JP | 2007-073555 A | 3/2007 |
| JP | 2008-205392 A | 9/2008 |

OTHER PUBLICATIONS

Quirk, Michael and Serda, Julian, Semiconductor Manufacturing Technology, 2001, Prentice Hall, Inc, pp. 275, 277, 279, 291.*
International Search Report of PCT/JP2009/052537, mailing date of May 26, 2009.

* cited by examiner

*Primary Examiner* — William D Coleman
*Assistant Examiner* — Christine Enad
(74) *Attorney, Agent, or Firm* — Westerman, Hattori, Daniels & Adrian, LLP

(57) ABSTRACT

The present invention is a method for fabricating a semiconductor device including the steps of: a first silicon nitride film having a refractive index of 2.2 or higher on a semiconductor layer made of a GaN- or InP-based semiconductor; forming, on the first silicon nitride film, a second silicon nitride film having a refractive index lower than that of the first silicon nitride; forming a source electrode and a drain electrode in areas in which the semiconductor layer is exposed; annealing the source electrode and the drain electrode in a state in which the first silicon nitride film and the second silicon nitride film are formed; and forming a gate electrode on the semiconductor layer between the source electrode and the drain electrode.

10 Claims, 12 Drawing Sheets

US 8,354,312 B2

SEMICONDUCTOR DEVICE FABRICATION METHOD

CROSS-REFERENCE TO RELATED APPLICATION

The present application is a continuation of and claims priority to International Patent Application No. PCT/JP2009/052537 filed on Feb. 16, 2009, which claims priority to Japanese Patent Application No. 2008-041345 filed on Feb. 22, 2008, subject matter of these patent documents is incorporated by reference herein in its entirety.

BACKGROUND (i) Technical Field

The present invention relates to semiconductor device fabrication methods, and more particularly, to a method for fabricating a semiconductor device in which a silicon nitride film is formed on a GaN- or InP-based semiconductor layer.

(ii) Related Art

A semiconductor device using a GaN-based semiconductor or an InP-based compound semiconductor layer, which may, for example, be an FET (Field Effect Transistor) such as HEMT (High Electron Mobility Transistor) has attracted attention as high-frequency, high-power amplifier device capable of operating at high frequencies and outputting high power such as an amplifier for use in a cellular phone base station.

Japanese Patent Application Publication No. 2006-278812 (Patent Document 1) discloses an art of forming a silicon nitride film having a composition ratio of silicon to nitrogen of 0.85 to 3.0 on a GaN-based semiconductor layer located between a source electrode and a gate electrode or between a drain electrode and a gate electrode (the above silicon film corresponds to a silicon nitride film having a refractive index of 2.2 or higher and will, hereinafter, be referred to as silicon-rich silicon nitride film).

According to the art described in Patent Document 1, excessive silicon in the silicon-rich silicon nitride film reacts on oxygen in gallium oxide at an interface between the GaN-based semiconductor layer and the silicon nitride film, and reduces the gallium oxide at the interface between the GaN-based semiconductor layer and the silicon nitride film. It is thus possible to suppress the collapse phenomenon that takes place when a high drain voltage is applied.

SUMMARY

According to an aspect of the present invention, there is provided a method for fabricating a semiconductor device including the steps of: a first silicon nitride film having a refractive index of 2.2 or higher on a semiconductor layer made of a GaN- or InP-based semiconductor; forming, on the first silicon nitride film, a second silicon nitride film having a refractive index lower than that of the first silicon nitride; forming a source electrode and a drain electrode in areas in which the semiconductor layer is exposed; annealing the source electrode and the drain electrode in a state in which the first silicon nitride film and the second silicon nitride film are formed; and forming a gate electrode on the semiconductor layer between the source electrode and the drain electrode.

According to another aspect of the present invention, there is provided a method for fabricating a semiconductor device including the steps of: forming a fist silicon nitride film having a refractive index of 2.2 or higher on a semiconductor layer made of a GaN- or InP-based semiconductor; forming, on the first silicon nitride film, an insulation film made of one of silicon oxide, aluminum oxide, tantalum oxide, strontium oxide, hafnium oxide, aluminum nitride, lanthanum oxide, yttrium oxide, and zirconium oxide; forming a source electrode and a drain electrode in areas in which the semiconductor layer is exposed; annealing the source electrode and the drain electrode in a stat in which the first silicon nitride film and the insulation film are formed; and forming a gate electrode on the semiconductor layer between the source electrode and the drain electrode.

DETAILED DESCRIPTION

The inventors found out that an instable phenomenon occurs due to the silicon-rich silicon nitride film in the FET configured to form the silicon-rich silicon nitride film on the GaN- or InP-based semiconductor layer. For example, the inventors found out that in the FET having the GaN-based semiconductor layer, the output power decreases when the drain current flows at high temperature (this phenomenon is called power slump).

As described above, the silicon-rich silicon nitride film formed on the GaN- or InP-based semiconductor layer suppresses the unwanted compound such as gallium oxide formed at the interface between the semiconductor layer and the silicon nitride film and suppresses the instable phenomenon such as the collapse phenomenon. However, the further instable phenomenon such as the power slump takes place.

According to an aspect of the present invention, an embodiment was made in view of the above problem and aims at reducing the occurrence of an instable phenomenon resulting from a silicon nitride film in an FET configured to form a silicon nitride film having a refractive index of 2.2 or higher on a GaN- or InP-based semiconductor layer.

Figure 3:
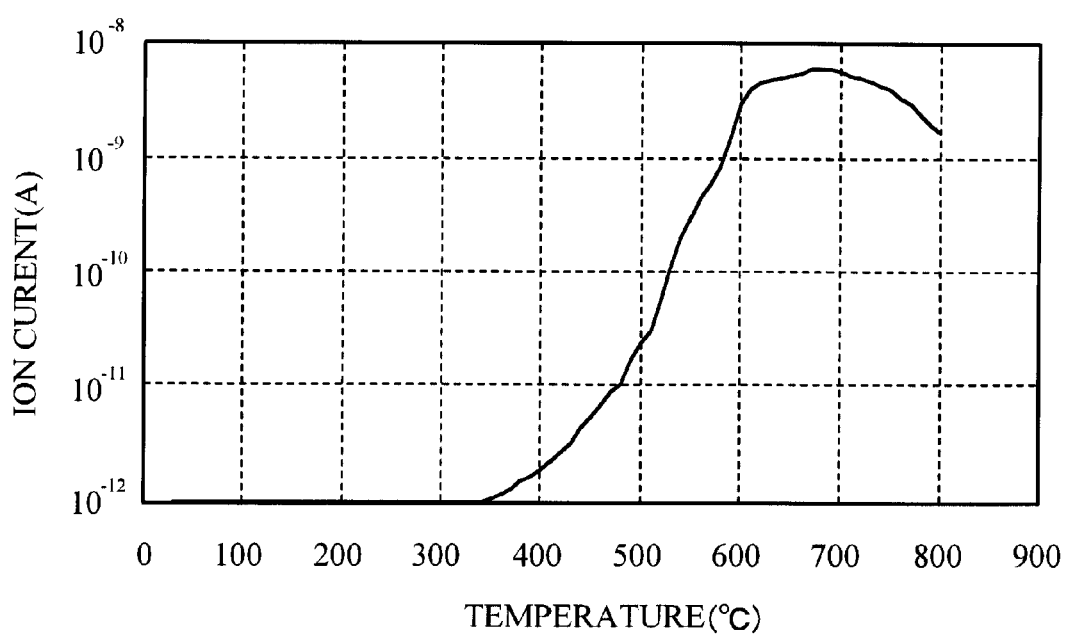
FIG. 3 is a diagram of temperature dependence of removal of hydrogen from the silicon nitride film.

First, a description will be given of an experiment through which the invention was made. The atomic composition ratio of silicon to nitrogen (Si/N) in the silicon nitride film has a correlation with the refractive index of the silicon nitride film immediately after it is grown, as illustrated in FIG. 3 of Patent Document 1. An Si/N composition ratio of 0.8 corresponds to a refractive index of 2.1-2.2.

Figure 1:
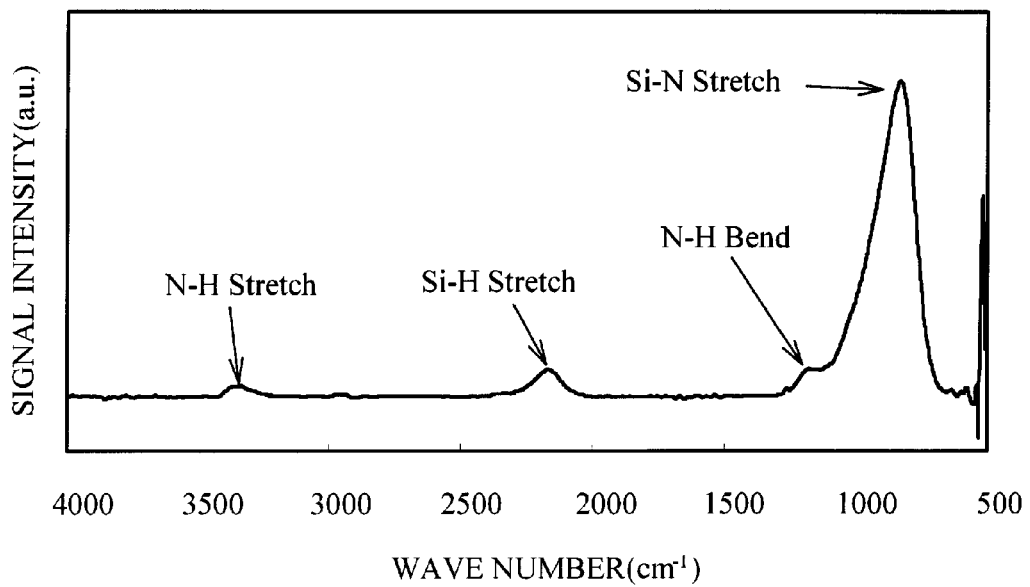
FIG. 1 is a diagram that illustrates an FTIR analysis result of a silicon nitride film.

FIG. 1 illustrates results of analyzing a silicon nitride film having a refractive index of 2.0 grown by PECVD (Plasma Enhanced Chemical Vapor Deposition) by using FT-IR (Fourier Transform Infrared Spectrometer). The horizontal axis denotes the wave number and the vertical axis denotes the signal intensity of an arbitrary scale. The growth temperature of the silicon nitride film is about 300° C. Referring to FIG. 1, "N—H" indicates a signal because of bonds of nitrogen and hydrogen and "Si—H" indicates a signal because of bonds of silicon and hydrogen. It can be seen from the above that hydrogen exists in the silicon nitride film, and not only the bonds of silicon and nitrogen but also the bonds of hydrogen and silicon and the bonds of hydrogen and nitrogen exist. The higher the Si/N composition ratio (that is, the higher the refractive index), the more the bonds of silicon and hydrogen.

Figure 2:
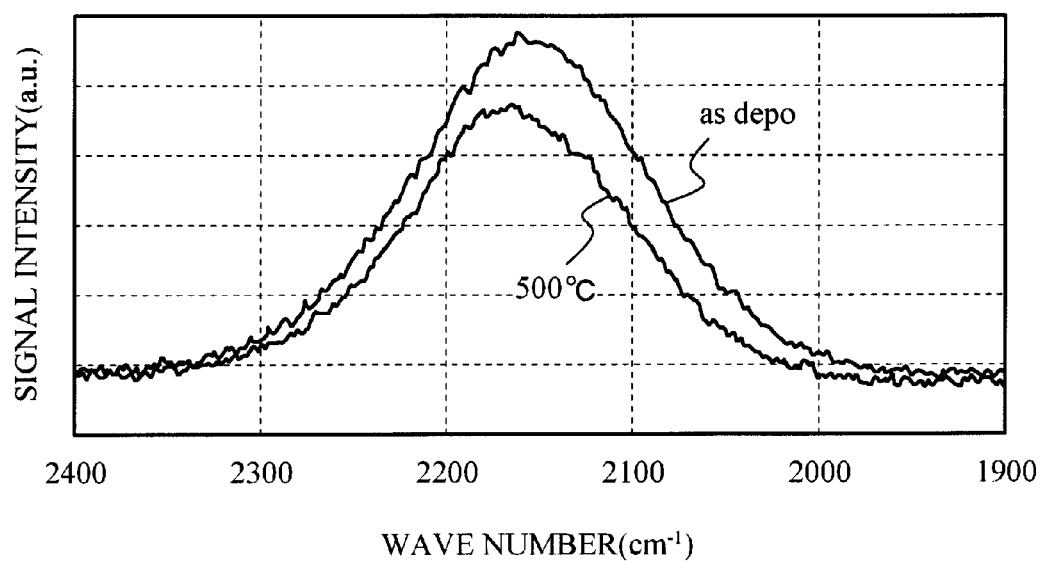
FIG. 2 is a diagram that illustrates variation in an Si—H signal due to annealing.

FIG. 2 is a diagram that enlarges parts close to Si—H signals of a silicon nitride film having a refractive index of 2.35, and illustrates a signal immediately after the silicon nitride film is grown (as depo) and another signal after the silicon nitride film is annealed at 500° C. Referring to FIG. 2, the bonds of silicon and hydrogen decrease by annealing. This shows that the bonds of silicon and hydrogen are broken and hydrogen is removed from the silicon nitride film.

FIG. 3 illustrates a result of investigation of the quantity of removed hydrogen when a silicon nitride film having a refractive index of 2.35 is annealed by using TDS (Thermal Desorption Spectroscopy). The horizontal axis denotes temperature, and the vertical axis denotes ion current of hydrogen, which is a quantity corresponding to the quantity of hydrogen removed from the silicon nitride film. Referring to FIG. 3, removal of hydrogen initiates when the temperature of the silicon nitride film exceeds 350° C. (which is 50° C. higher than the temperature at which the silicon nitride film is grown). When the temperature of the silicon nitride film is equal to or higher than 500° C., hydrogen is removed drastically. The quantity of removed hydrogen is saturated when the temperature rises over 600° C. The inventors found out that hydrogen is removed by annealing in the silicon-rich silicon nitride film, as described above.

Taking the above experimental results into consideration, the inventors supposed that the instable phenomenon such as power slump is caused by such a factor that electrons in the GaN-based semiconductor layer are captured to non-bonded arms of Si resulting from removal of hydrogen. A factor of removal of hydrogen may be annealing after the source electrode and the drain electrode are formed.

Figure 4:
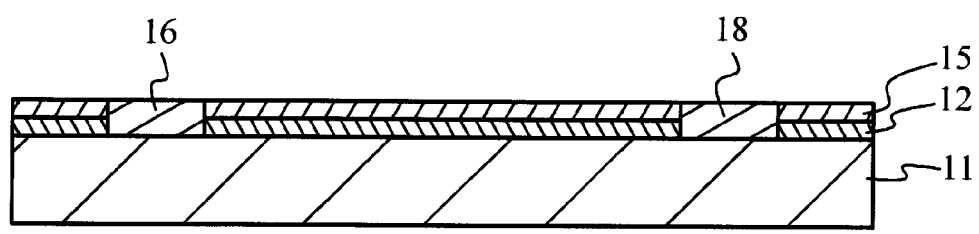
FIG. 4 is a diagram for describing the principle of the present invention.

FIG. 4 is a diagram for describing the principle of the present invention, and is a cross-sectional view that illustrates a fabrication step of FET. Referring to FIG. 4, a source electrode 16 and a drain electrode 18 are formed on a GaN- or InP-based semiconductor layer 11. A silicon-rich silicon nitride film 12 and an insulation film 15 are formed on the semiconductor layer 11 between the source electrode 16 and the drain electrode 18. In this state, annealing is carried out. The silicon-rich silicon nitride film 12 is a film having a refractive index of 2.2 or higher, and is formed so as to be thin within a thickness enough to react impurity elements such as oxygen at an interface between the semiconductor layer 11 and the silicon nitride film 12. It is thus possible to reduce the impurity elements at the interface between the semiconductor layer 11 and the silicon nitride film 12 and to suppress instable phenomenon such as the collapse phenomenon. The insulation film 15 is a silicon nitride film from which hydrogen is hard to be removed, and the above silicon nitride film has a low refractive index. Alternatively, the insulation film 15 is an insulation film in which charges such as electrons are hard to be captured. It is thus possible to restrain the charges in the semiconductor layer 11 such as electrons from being captured in the insulation film 15 and to suppress the instable phenomenon resulting from capturing the charges in the insulation film 15 such as power slump.

Exemplary embodiments of the invention will now be described.

Embodiment 1

Figure 5A:
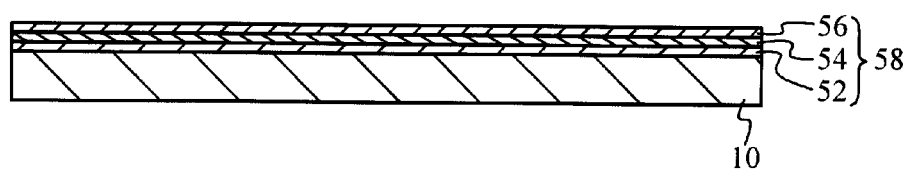
FIGS. 5A through 5D are cross-sectional views that illustrate a method for fabricating a semiconductor device in accordance with embodiment 1 (part 1)
Figure 5B:
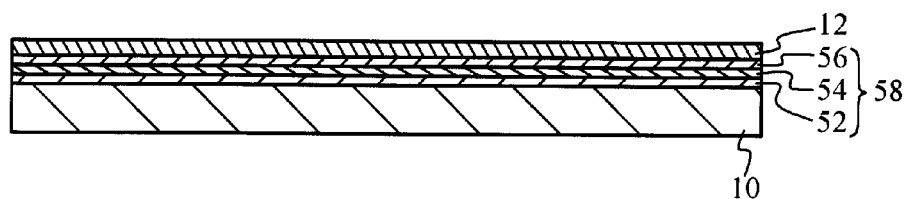
Figure 5C:
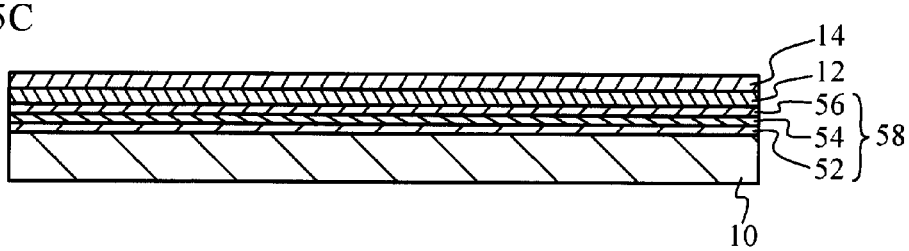
Figure 5D:
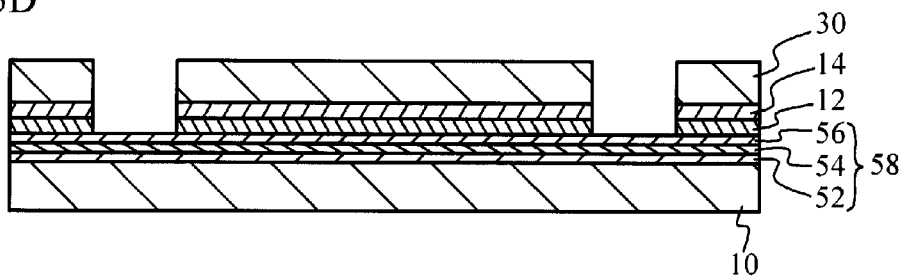

Embodiment 1 is an example in which the insulation film is a silicon nitride film having a low refractive index. FIG. 5A through FIG. 7C are diagrams that illustrate a method for fabricating a semiconductor device in accordance with embodiment 1. Referring to FIG. 5A, on a substrate 10 made of SiC, Si or sapphire, formed are a GaN travel layer 52, an AlGaN electron supply layer 54, and a GaN cap layer 56 by MOCVD (Metal Organic CVD). The GaN travel layer 52, the AlGaN electron supply layer 54 and the GaN cap layer 56 form an epitaxial layer 58. Referring to FIG. 5B, a first silicon nitride film 12 that has a refractive index of 2.35 and a film thickness of 10 nm is formed on the GaN cap layer 56 at a growth temperature of about 300° C. by using PECVD. Referring to FIG. 5C, a second silicon nitride film 14 that has a refractive index of 2.0 and a film thickness of 10 nm is formed on the first silicon nitride film 12 at a growth temperature of about 300° C. Referring to FIG. 5D, a photoresist 30 is formed on the second silicon nitride film 14, and the GaN cap layer 56 is exposed in areas in which the source electrode and the drain electrode are formed by an exposure method and an etching method.

Figure 6A:
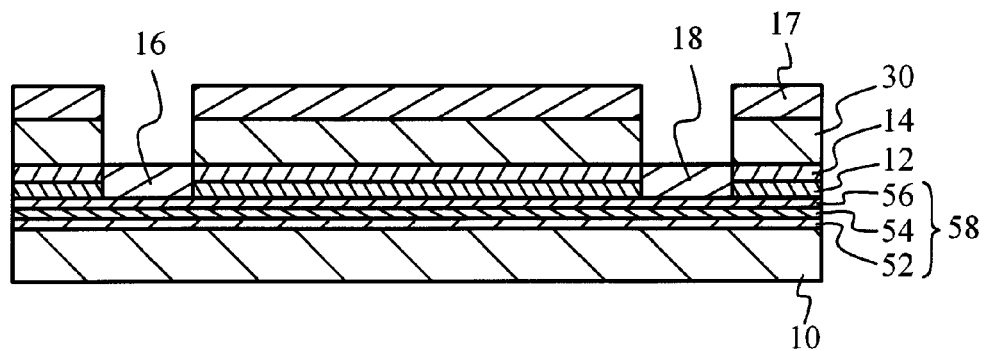
FIGS. 6A through 6C are cross-sectional views that illustrate the method for fabricating the semiconductor device in accordance with embodiment 1 (part 2)
Figure 6B:
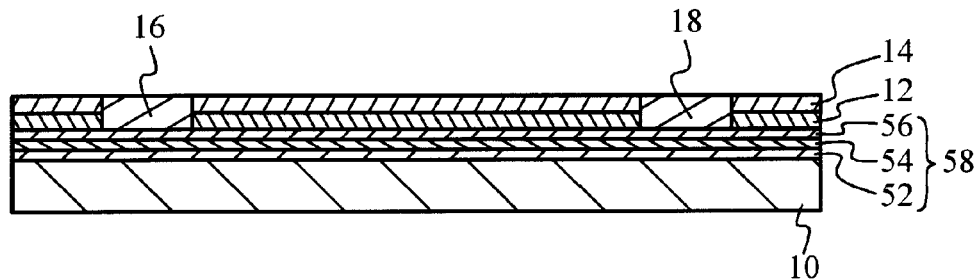
Figure 6C:
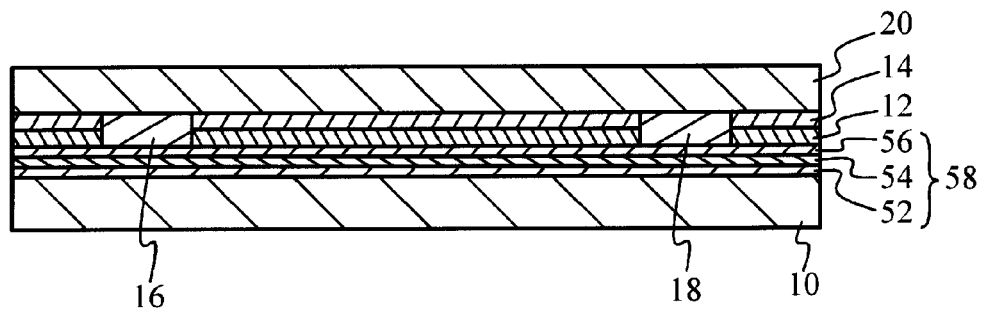

Referring to FIG. 6A, Ta and Al are evaporated in turn from the epitaxial layer 58 side, and the source electrode 16 and the drain electrode 18 are formed in the areas in which the GaN cap layer 56 is exposed. An evaporated material 17 of Ta and Al is also formed on the photoresist 30. Referring to FIG. 6B, after liftoff, the source electrode 16 and the drain electrode 18 are annealed at 565° C. in the state in which the first silicon nitride film 12 and the second silicon nitride film 14 are formed. Thus, the source electrode 16 and the drain electrode 18 are brought into ohmic-contact to the GaN cap layer 56. Referring to FIG. 6C, a third silicon nitride film 20 that has a refractive index of 2.0 and a film thickness of 40 nm is formed on the source electrode 16, the drain electrode 18 and the second silicon nitride film 14 at a growth temperature of about 300° C. by PECVD. The third silicon nitride film 20 is a protection film for protecting the gaps between the source electrode 16 or the drain electrode 18 and the second silicon nitride film 14.

Figure 7A:
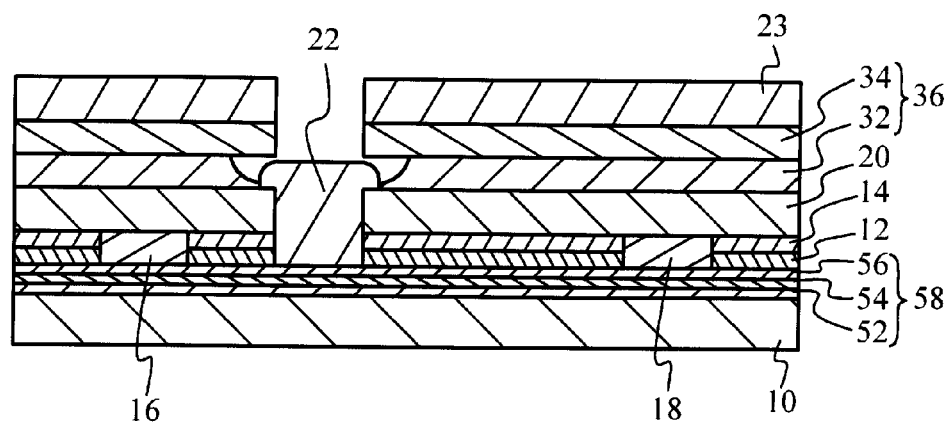
FIGS. 7A through 7C are cross-sectional views that illustrate the method for fabricating the semiconductor device in accordance with embodiment 1 (part 3)
Figure 7B:
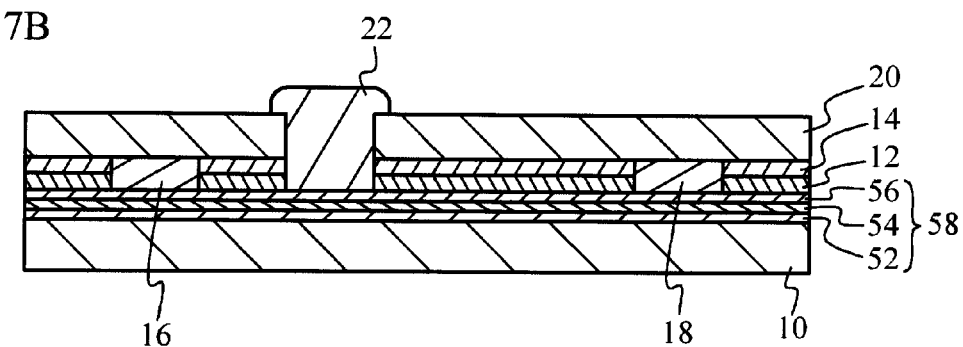
Figure 7C:
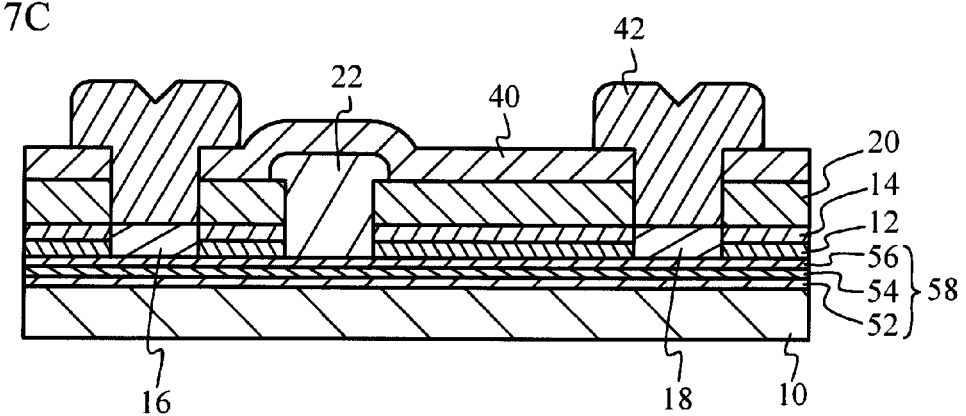

Referring to FIG. 7A, a two-layer photoresist 36 composed of a lower layer 32 and an upper layer 34 is formed. From the epitaxial layer 58 side, Ni and Au are evaporated in turn. An evaporated material 23 is formed on the photoresist 36. Thus, the gate electrode 22 is formed on the GaN cap layer 56 between the source electrode 16 and the drain electrode 18. Referring to FIG. 7B, liftoff is performed. Referring to FIG. 7C, a silicon nitride film 40 having a film thickness of 400 nm is grown by PECVD. Then, a photoresist (not illustrated) is formed on the silicon nitride film 40, and the surfaces of the source electrode 16 and the drain electrode 18 are exposed. TiW is formed on the source electrode 16 and the drain electrode 18 by evaporation, and then, Au is formed thereon by plating. Finally, liftoff of the photoresist is performed. This results in interconnection layer 42 composed of TiW and Au. Now, the FET of embodiment 1 is completed.

Figure 8:
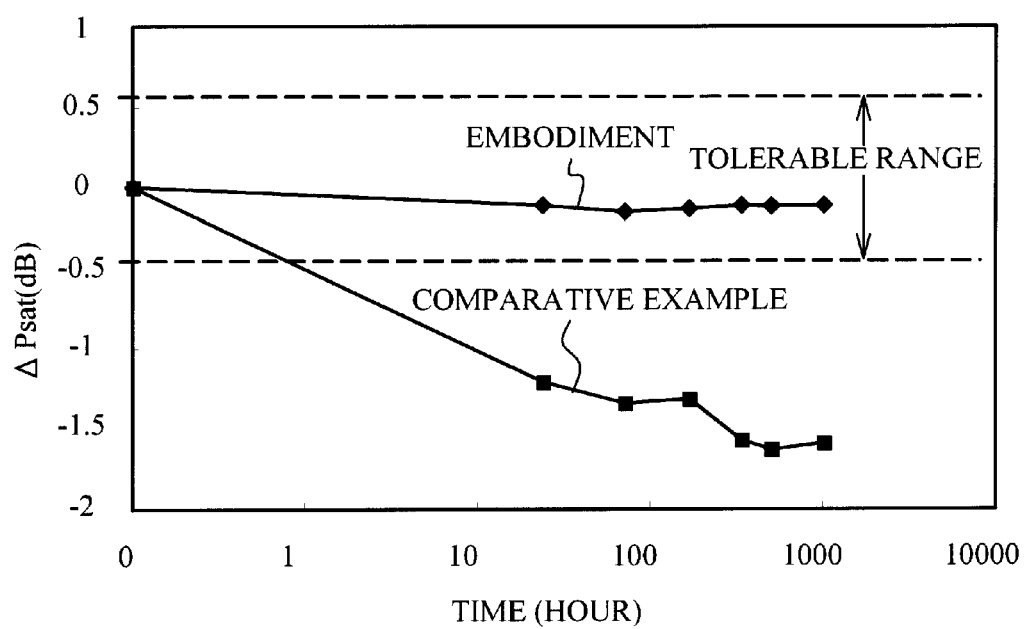
FIG. 8 is a diagram that illustrates power slumps of a comparative example and embodiment 1.

FIG. 8 is a diagram that illustrates results of a test of energizing of FETs configured in accordance with a comparative example and embodiment 1. The comparative example is an FET in which only the first silicon nitride film 12 is grown. A method for fabricating the comparative example is as follows. In FIG. 5B, the first silicon nitride film 12 that has a refractive index of 2.35 and a film thickness of about 50 nm is grown, and the steps of FIGS. 5D through 7C are carried out without forming the second silicon nitride film 14 illustrated in FIG. 5C. The other fabrication steps are the same as those of FIGS. 5A through 7C.

The gate lengths and the gate widths of the comparative example and embodiment 1 are 0.6 μm and 2.25 mm, respectively. The energizing condition has a channel temperature of 250° C., a drain voltage of 50 V, and a drain current of 100 mA. The horizontal axis of FIG. 8 is the energizing time, and the vertical axis denotes variation ΔPsat in the saturated power before energizing is initiated. The saturated power is measured in such a manner that energizing is stopped to return the temperature to room temperature and the output power of RF is then measured.

Referring to FIG. 8, in the comparative example, the saturated power is reduced due to high-temperature energizing, and the power slump is observed. In contrast, there is little variation in the saturated power even after high-temperature energizing. As described above, according to embodiment 1, the power slump may be suppressed, as compared to the comparative example.

Figure 9:
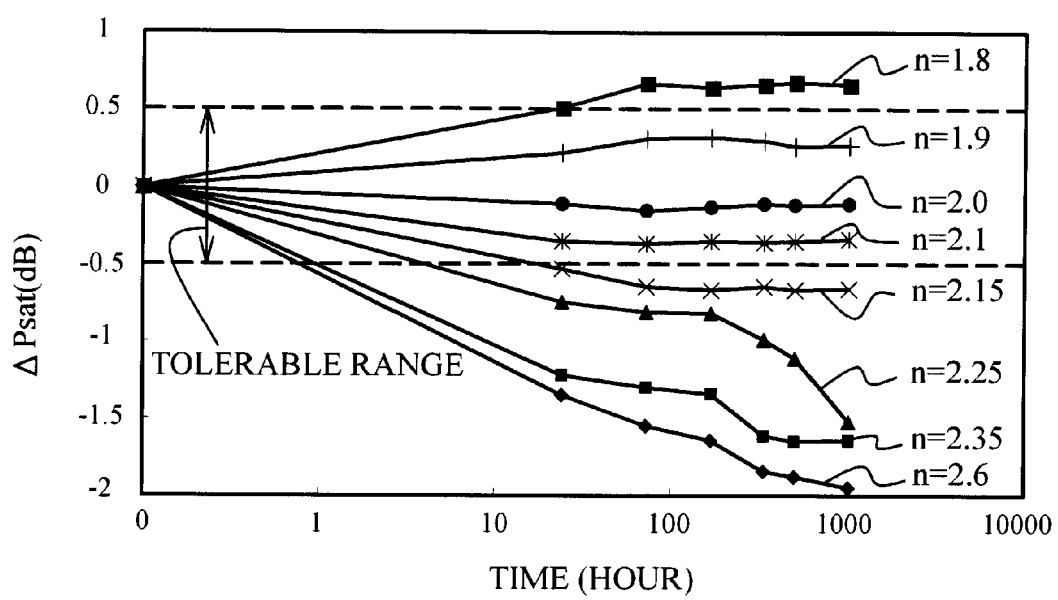
FIG. 9 is a diagram that illustrates a power slump obtained when the refractive index of a second silicon nitride film is changed.

FIG. 9 is a diagram that illustrates results of a high-temperature energizing test of sample FETs in which the refractive index of the second silicon nitride film 14 is within the range of 1.8 to 2.6. The method for the high-temperature energizing test is the same as illustrated in FIG. 8. In FIG. 5C, the sample FETs were prepared so that the refractive indexes of the second silicon nitride films 14 of the sample FETs are 1.8, 1.9, 2.0, 2.1, 2.15, 2.25, 2.35 and 2.6, and the other fabrications steps are the same as those illustrated in FIGS. 5A through 7C.

Referring to FIG. 9, when the second silicon nitride film 14 has a high refractive index, ΔPsat decreases greatly as the energizing time increases. In contrast, when the second silicon nitride film has a low refractive index, the power slump is small. From FIG. 9, variation ΔPsat of the saturated power is within a tolerable range when the refractive index of the second silicon nitride film 14 is 1.9 to 2.1.

The following may be considered as the reason why the power slump takes place when the second silicon nitride film 14 has a high refractive index. As has been described previously, hydrogen in the first silicon nitride film 12 having a high refractive index and the second silicon nitride film 14 is removed by annealing (see FIG. 6B) at 565° C. for obtaining ohmic contacts of the source electrode 16 and the drain electrode 18. Thus, many arms of silicon that are not bonded are formed in the first silicon nitride film 12 and the second silicon nitride film 14. By the high-temperature drain energizing, the charges in semiconductor of the FET are captured by the arms of silicon that are not bonded in the first silicon nitride film 12 and the second silicon nitride film 14. The above may cause the power slump.

The following may be considered as the reason why the power slump is suppressed in the case where the second silicon nitride film 14 has a low refractive index. When the refractive index of the second silicon nitride film 14 is low, hydrogen and nitrogen are bonded strongly, and hydrogen bonded to nitrogen is hard to be removed even at high temperature. Thus, hydrogen in the second silicon nitride film 14 is not removed even by annealing the source electrode 16 and the drain electrode 18. This makes it possible to prevent the charges from being captured in the second silicon nitride film 14 even by drain energizing at high temperature and to suppress the occurrence of power slump.

According to Patent Document 1, it is desired that the refractive index of the first silicon nitride film 12 should be 2.2 or higher in order to suppress the collapse phenomenon. In order to suppress the power slump, the refractive index of the second silicon nitride film 14 is lower than that of the first silicon nitride film 12. Thus, it is possible to suppress the power slump as well as the collapse phenomenon.

When the refractive index of the first silicon nitride film 12 is 2.6 or higher, the silicon nitride film is amorphous silicon, and leakage current between the gate electrode 22 and the drain electrode 18 increases. It is thus preferable that the refractive index of the first silicon nitride film 12 is equal to or lower than 2.6. The refractive index of the first silicon nitride film 12 is preferably in the range of 2.2 to 2.5, and is more preferably in the range of 2.3 to 2.4.

Figure 10A:
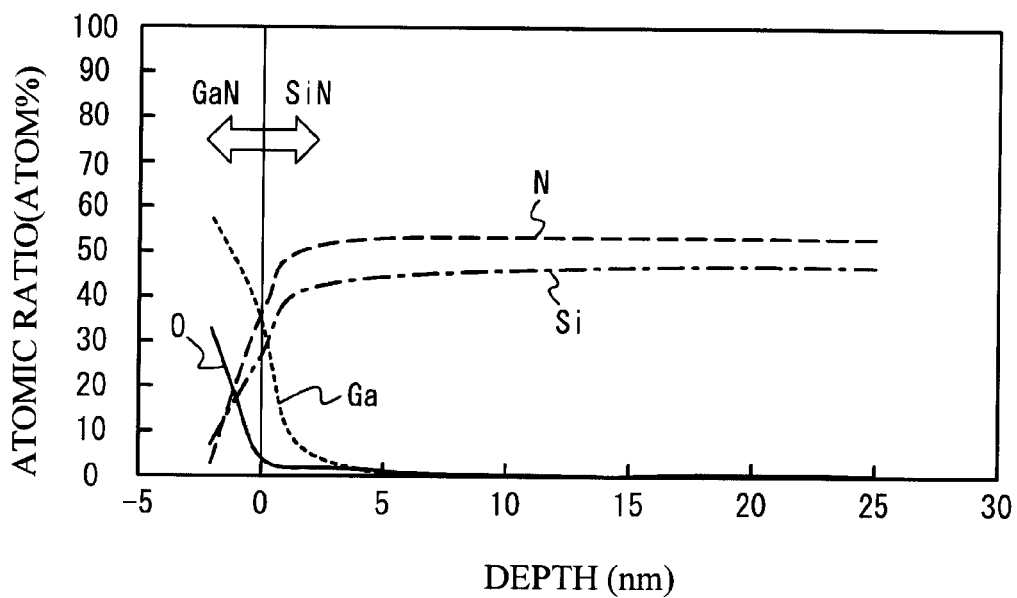
FIG. 10A illustrates a pre-annealing atomic profile of a sample in which SiN is formed on GaN and the refractive index of SiN is 2.2.
Figure 10B:
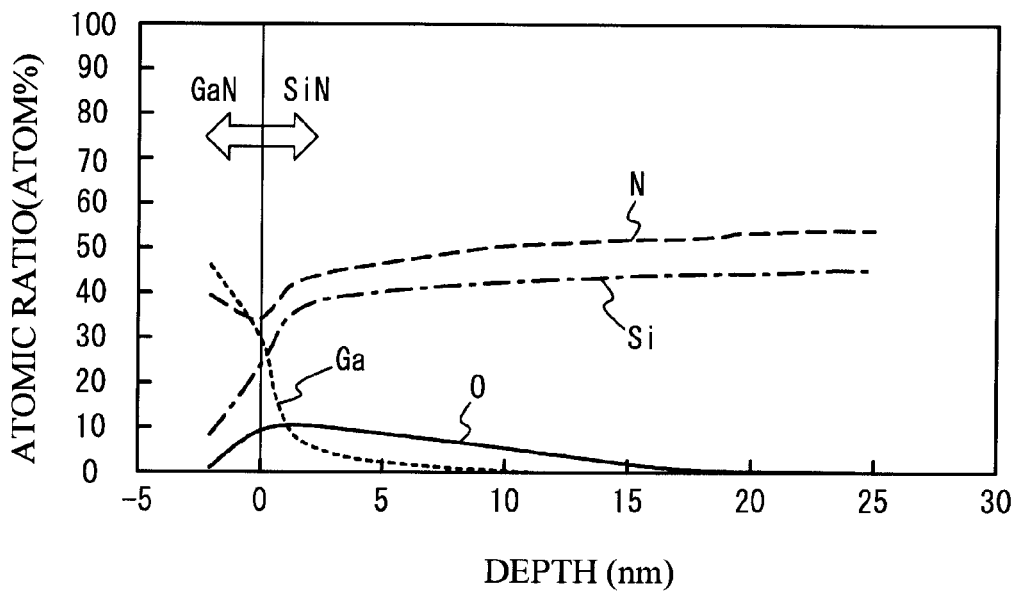
FIG. 10B illustrates a post-annealing atomic profile.

FIG. 10A is a diagram that illustrates a profile of an atomic ratio of Si, N, Ga and O with respect to the depth of a sample in which a silicon nitride film having a refractive index of 2.2 is formed on a GaN layer by PECVD prior to annealing. FIG. 10B is a diagram that illustrates a profile of an atomic ratio with respect to the depth of a sample similar to that in FIG. 10A after annealing at 565° C. In FIGS. 10A and 10B, a position at which the depth is zero is the interface between GaN and SiN. A region in which the depth is positive is SiN, and another region in which the depth is negative is GaN. These analyses use XPS (X-ray Photoelectron Spectroscopy) while the samples are being etched.

Referring to FIGS. 10A and 10B, O (oxygen) in the GaN layer is taken to the silicon nitride film due to annealing. Thus, oxygen at the interface of the GaN layer to the silicon nitride film is decreased. After annealing, oxygen is detected in the depth up to about 20 nm from the interface of the silicon nitride film. That is, a film thickness of about 20 nm of the silicon nitride film makes it possible to considerably take oxygen from the GaN layer to the silicon nitride film.

Figure 11A:
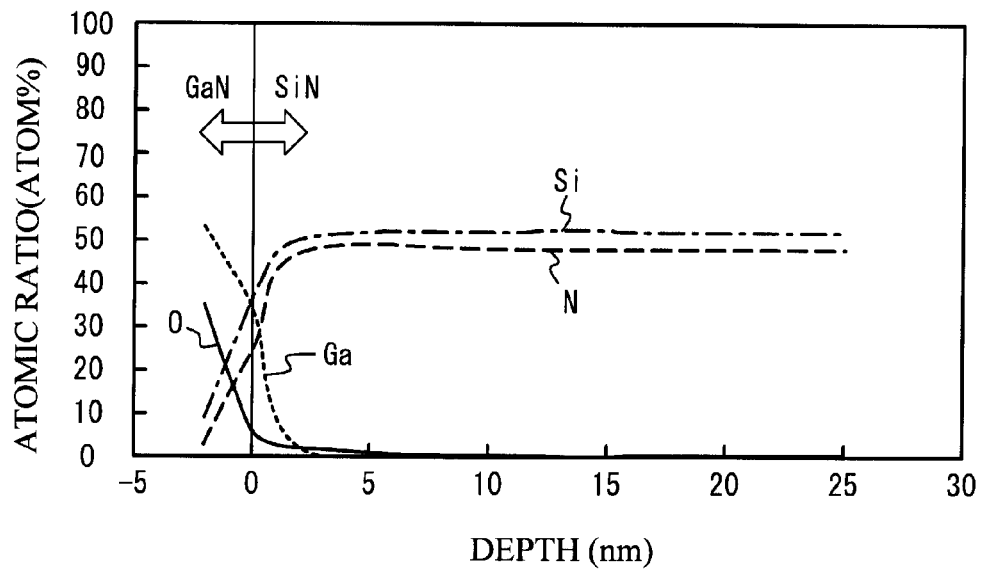
FIG. 11A illustrates a pre-annealing atomic profile of a sample in which SiN is formed on GaN and the refractive index of SiN is 2.6.
Figure 11B:
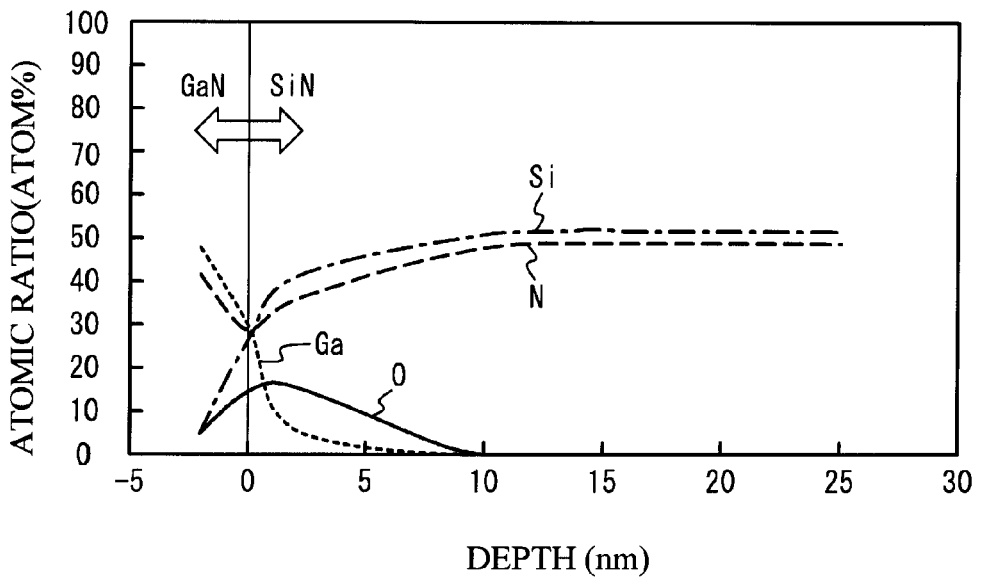
FIG. 11B illustrates a post-annealing atomic profile.

FIGS. 11A and 11B illustrate profiles of atomic ratios with respect to the depth of samples in which a silicon nitride film having a refractive index of 2.6 is formed on a GaN layer by PEDVD prior to and after annealing at 565° C., respectively. Referring to FIGS. 11A and 11B, O (oxygen) in the GaN layer is taken to the silicon nitride film due to annealing. After annealing, oxygen is detected in the depth up to about 10 nm from the interface of the silicon nitride film. That is, a film thickness of about 10 nm of the silicon nitride film makes it possible to considerably take oxygen from the GaN layer to the silicon nitride film.

From FIG. 10B, in order to suppress oxygen and the like at the interface between the semiconductor layer and the first silicon nitride film 12, the film thickness of the first silicon nitride film 12 may be set equal to or more than 10 nm. Further, in order to restrain the charges in the semiconductor layer from being captured by the arms of silicon that are not bonded in the first silicon nitride film 12, it is preferable that the first silicon nitride is thin. From FIG. 11B, the effect of taking oxygen to the silicon nitride film is not enhanced even when the film thickness of the first silicon nitride film is 20 nm or more. That is, it is preferable that the film thickness of the first silicon nitride film is equal to or less than 20 nm. Thus, in the range of 2.2 to 2.6 of the refractive index of the first silicon nitride film 12, the film thickness of the first silicon nitride film 12 is preferably in the range of 10 nm to 20 nm.

The tolerable range of variation of saturated power by high-temperature energizing is generally ±0.5 dB. Thus, from FIG. 9, it is preferable that the refractive index of the second silicon nitride film 14 is equal to or higher than 1.9 and is equal to or lower than 2.1. The film thickness of the second silicon nitride film 14 is preferably equal to or more than 10 nm in terms of preventing removal of hydrogen, and is preferably equal to or less than 100 nm in terms of producing the fine gate electrode.

From FIG. 3, hydrogen in the silicon nitride film is removed by annealing at a temperature that is 50° C. or higher than the growth temperature of the silicon nitride film. Thus, when the anneal temperature is 50° C. or higher than the growth temperature of the first silicon nitride film 12, the power slump is likely to occur, and the second silicon nitride film 14 is preferably employed. When the temperature of annealing for making ohmic contacts in FIG. 6B is 500° C. or higher, hydrogen in the silicon nitride film is likely to be removed. Further, when the anneal temperature is 550° C. or higher, hydrogen in the silicon nitride film is more likely to be removed. Thus, the use of the second silicon nitride film 14 is advantageous when the anneal temperature is 500° C., preferably, when the anneal temperature is 550° C.

An exemplary condition for growing the first silicon nitride film 12 and the second silicon nitride film 14 may have a growth temperature of about 300° C., an SiH4 flow rate of 4-15 sccm, an NH3 flow rate of 0-8 sccm, an N2 flow rate of 20-700 sccm, an He flow rate of 0-800 sccm, and an RF power of 0.04-0.24 W/cm2.

Embodiment 2

Figure 12A:
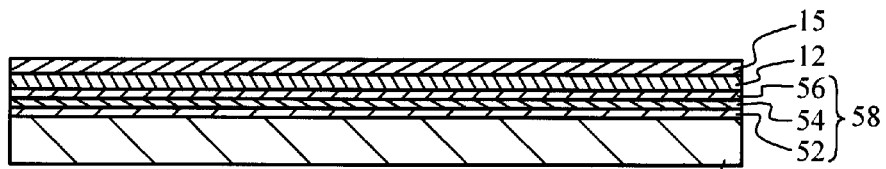
FIGS. 12A through 12E are cross-sectional views that illustrate a method for fabricating a semiconductor device in accordance with embodiment 2.
Figure 12B:
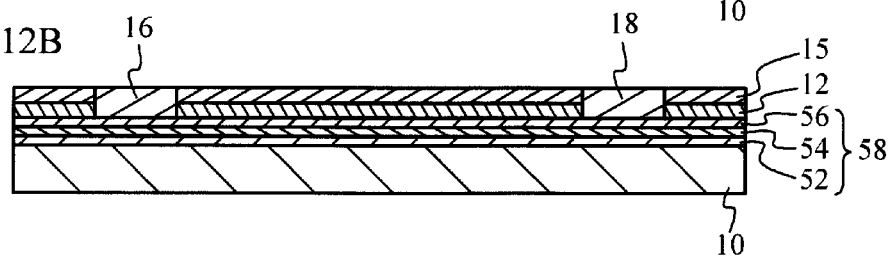
Figure 12C:
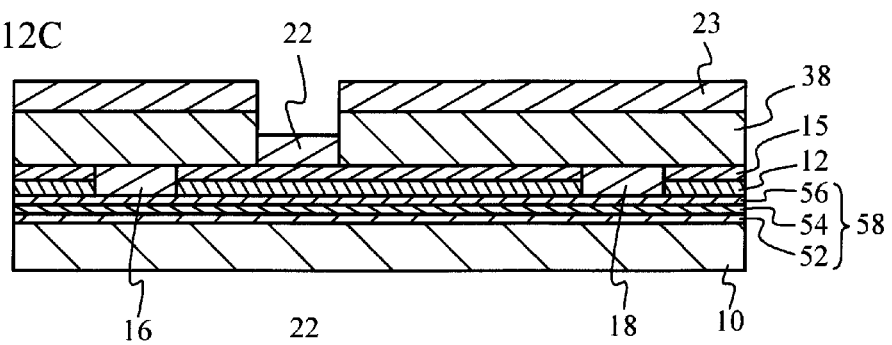
Figure 12D:
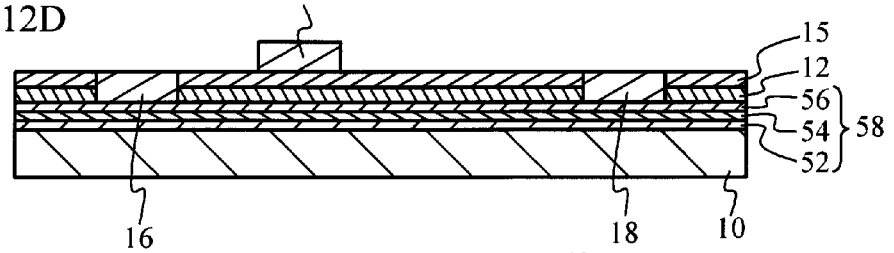
Figure 12E:
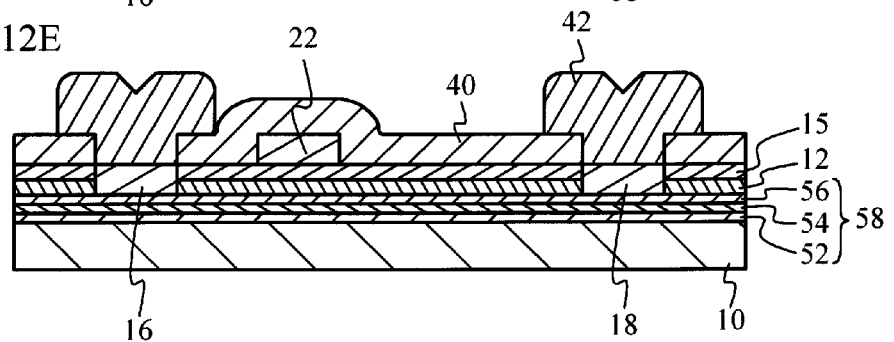

Embodiment 2 is an example in which the insulation film formed on the first silicon nitride film is other than the silicon nitride film. FIG. 12A through FIG. 12E are diagrams that illustrate a method for fabricating a semiconductor device in accordance with embodiment 2. Referring to FIG. 12A, the insulation film 15 is formed on the first silicon nitride film 12 after FIG. 5C of embodiment 1. The insulation film 15 is any of silicon oxide, aluminum oxide, tantalum oxide, strontium oxide, hafnium oxide, aluminum nitride, lanthanum oxide, yttrium oxide, and zirconium oxide. Referring to FIG. 12B, as in the case of FIG. 6B of embodiment 1, the source electrode 16 and the drain electrode 18 are formed. Referring to FIG. 12C, a photoresist 38 having an opening in a gate electrode forming area is formed on the source electrode 16, the drain electrode 18 and the insulation film 15. The gate electrode 22 is evaporated. The evaporated material 23 is formed on the photoresist 38. Referring to FIG. 12D, liftoff is carried out. Referring to FIG. 12E, as in the case of FIG. 7C of embodiment 1, the silicon nitride film 40 and the interconnection layer 42 are formed. Through the above fabrication steps, the FET of embodiment 2 is completed.

According to embodiment 2, the insulation film 15 is used instead of the second silicon nitride film 14 employed in embodiment 1. The insulation film 15 is hard to capture charges, as compared to the silicon nitride film. Thus, the power slump may be suppressed.

The gate electrode 22 may be formed on the insulation film 15 so that a MIS (Metal Insulator Semiconductor) FET may be configured. That is, the step of forming the gate electrode 22 in FIG. 10 may be varied so as to form the gate electrode 22 on the insulation film 15. Particularly, when it is difficult to etch the insulation film 15, it is preferable that the gate electrode 22 is formed on the insulation film 15. The gate insulation film may include a film other than the insulation film 15.

In embodiments 1 and 2, the FETs having the GaN-based semiconductor layers are described as an example. The semiconductor layer on which the first silicon nitride film 12 is formed may be on the AlGaN electron supply layer 54. In the FET having the GaN-based semiconductor layer on the surface, as described in Patent Document 1, it is preferable to reduce gallium oxide on the surface. Thus, the semiconductor layer on which the first silicon nitride film 12 is formed may be another GaN-based semiconductor layer. The GaN-based semiconductor may be AlN, InN, InGaN other than GaN and AlGaN.

In the FET having the In-P-based semiconductor layer on the surface, P in the InP-based semiconductor is likely to be removed, and the surface of the InP-based semiconductor is In-rich. In this case, In is bonded to oxygen in the atmosphere, and In oxide is formed. As in the case of embodiments 1 to 2, even in the case where a silicon-rich silicon nitride film is formed on the InP-based semiconductor, it is possible to remove impurities such as In oxide at the interface between the InP-based semiconductor and the first silicon nitride film 12. Thus, the FET having the InP-based semiconductor layer is capable of suppressing the collapse phenomenon and the power slump as in the case of the FET having the GaN-based semiconductor layer. The InP-based semiconductor may be InP, InGaP, InAlGaP, and so on.

Preferable embodiments of the present invention have been described in detail. However, the present invention is not limited to the specific embodiments, but various variations and changes may be made without the scope of the invention as claimed.

What is claimed is:

1. A method for fabricating a semiconductor device comprising the steps of:
   forming a first silicon nitride film having a refractive index of 2.2 or higher on a semiconductor layer made of a GaN- or InP-based semiconductor;
   forming, on the first silicon nitride film, a second silicon nitride film having a refractive index lower than that of the first silicon nitride;
   forming a source electrode and a drain electrode in areas in which the semiconductor layer is exposed;
   annealing the source electrode and the drain electrode in a state in which the first silicon nitride film and the second silicon nitride film are formed; and
   forming a gate electrode in an area in which the semiconductor layer is exposed on the semiconductor layer between the source electrode and the drain electrode,
   wherein the first silicon nitride film directly underlies the entire second silicon nitride film.

2. The method according to claim 1, wherein the first silicon nitride film has a film thickness of 10-20 nm.

3. The method according to claim 1, wherein the first silicon nitride film has a refractive index of 2.6 or lower.

4. The method according to claim 1, wherein the step of annealing is performed at a temperature that is 50° C. or higher than a temperature at which the first silicon nitride film is formed.

5. The method according to claim 1, wherein the second silicon nitride film has a refractive index that is equal to or higher than 1.9 and is equal to or lower than 2.1.

6. The method according to claim 1, wherein the second silicon nitride film has a film thickness of 10-100 nm.

7. A method for fabricating a semiconductor device comprising the steps of:
- forming a first silicon nitride film having a refractive index of 2.2 or higher on a semiconductor layer made of a GaN- or InP-based semiconductor;
- forming, on the first silicon nitride film, an insulation film made of one of silicon oxide, aluminum oxide, tantalum oxide, strontium oxide, hafnium oxide, aluminum nitride, lanthanum oxide, yttrium oxide, and zirconium oxide;
- forming a source electrode and a drain electrode in areas in which the semiconductor layer is exposed;
- annealing the source electrode and the drain electrode in a state in which the first silicon nitride film and the insulation film are formed; and
- forming a gate electrode on the semiconductor layer insulation film between the source electrode and the drain electrode, wherein the first silicon nitride film directly underlies the entire insulation film.

8. The method according to claim 7, wherein the first silicon nitride film has a film thickness of 10-20 nm.

9. The method according to claim 7, wherein the first silicon nitride film has a refractive index of 2.6 or lower.

10. The method according to claim 7, wherein the step of annealing is performed at a temperature that is 50° C. or higher than a temperature at which the first silicon nitride film is formed.

* * * * *